United States Patent
Kuo

(10) Patent No.: US 10,714,452 B2
(45) Date of Patent: Jul. 14, 2020

(54) PACKAGE STRUCTURE AND METHOD OF MANUFACTURING THE SAME

(71) Applicant: UNITED MICROELECTRONICS CORP., Hsin-Chu (TW)

(72) Inventor: Chien-Li Kuo, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/911,180

(22) Filed: Mar. 5, 2018

(65) Prior Publication Data

US 2018/0190623 A1 Jul. 5, 2018

Related U.S. Application Data

(62) Division of application No. 14/287,065, filed on May 26, 2014, now Pat. No. 9,947,640.

(30) Foreign Application Priority Data

Apr. 28, 2014 (CN) .......................... 2014 1 0174317

(51) Int. Cl.
*H01L 25/065* (2006.01)
*H01L 25/00* (2006.01)
(Continued)

(52) U.S. Cl.
CPC ........ *H01L 25/0657* (2013.01); *H01L 21/563* (2013.01); *H01L 21/78* (2013.01);
(Continued)

(58) Field of Classification Search
CPC ......... H01L 25/0657; H01L 2224/0401; H01L 2224/131; H01L 2224/13147; H01L 2224/16148; H01L 2224/16268; H01L 2224/32145; H01L 2224/32265; H01L 2224/45015; H01L 2224/45099; H01L 2224/48145; H01L 2224/73204; H01L 2224/81; H01L 2224/81193; H01L 2224/83; H01L 2224/85; H01L 2224/92125; H01L 2224/94; H01L 2224/97; H01L 2225/06513; H01L 2225/06517; H01L 2225/065568; H01L 2225/06572; H01L 23/3114; H01L 24/13; H01L 24/16; H01L 24/32; H01L 24/48; H01L 24/73; H01L 24/81; H01L 24/92;
(Continued)

(56) References Cited

U.S. PATENT DOCUMENTS 5,206,181 A 4/1993 Gross
7,951,647 B2 5/2011 Yang
(Continued)

FOREIGN PATENT DOCUMENTS

CN 101258583 A 9/2008

*Primary Examiner* — Vongsavanh Sengdara
(74) *Attorney, Agent, or Firm* — Winston Hsu

(57) ABSTRACT

The present invention provides a method of manufacturing a package structure. An array chip including a plurality of first dies is provided. A wafer including a plurality of second dies is provided. A package step is carried out to package the array chip onto the wafer so as to electrically connect the first die and the second die. The present invention further provides a semiconductor wafer and a package structure.

4 Claims, 11 Drawing Sheets

(51) Int. Cl.
  *H01L 21/78* (2006.01)
  *H01L 23/00* (2006.01)
  *H01L 21/56* (2006.01)
  *H01L 25/18* (2006.01)
  *H01L 23/31* (2006.01)

(52) U.S. Cl.
  CPC .............. *H01L 24/94* (2013.01); *H01L 24/97* (2013.01); *H01L 25/18* (2013.01); *H01L 25/50* (2013.01); *H01L 21/561* (2013.01); *H01L 23/3114* (2013.01); *H01L 24/13* (2013.01); *H01L 24/16* (2013.01); *H01L 24/32* (2013.01); *H01L 24/48* (2013.01); *H01L 24/73* (2013.01); *H01L 24/81* (2013.01); *H01L 24/92* (2013.01); *H01L 2224/0401* (2013.01); *H01L 2224/131* (2013.01); *H01L 2224/13147* (2013.01); *H01L 2224/16148* (2013.01); *H01L 2224/16268* (2013.01); *H01L 2224/32145* (2013.01); *H01L 2224/32265* (2013.01); *H01L 2224/45015* (2013.01); *H01L 2224/45099* (2013.01); *H01L 2224/48145* (2013.01); *H01L 2224/73204* (2013.01); *H01L 2224/81193* (2013.01); *H01L 2224/85* (2013.01); *H01L 2224/92125* (2013.01); *H01L 2224/94* (2013.01); *H01L 2224/97* (2013.01); *H01L 2225/06513* (2013.01); *H01L 2225/06517* (2013.01); *H01L 2225/06568* (2013.01); *H01L 2225/06572* (2013.01); *H01L 2924/00014* (2013.01)

(58) Field of Classification Search
  CPC ......... H01L 24/94; H01L 24/97; H01L 28/18; H01L 25/50; H01L 2924/00012; H01L 2924/00014; H01L 2924/014; H01L 2924/207
  See application file for complete search history.

(56) References Cited

U.S. PATENT DOCUMENTS

| | | |
|---|---|---|
| 8,486,758 B2 | 7/2013 | Oganesian |
| 8,557,680 B2 | 10/2013 | Chandrasekaran |
| 2002/0167079 A1* | 11/2002 | Pu ................ H01L 21/563 257/685 |
| 2004/0113253 A1* | 6/2004 | Karnezos ......... H01L 21/563 257/686 |
| 2004/0245652 A1* | 12/2004 | Ogata ............... H01L 24/03 257/777 |
| 2007/0045875 A1* | 3/2007 | Farnworth ........ H01L 21/568 257/787 |
| 2008/0153265 A1 | 6/2008 | Lyne |
| 2008/0164605 A1* | 7/2008 | Wu ................. H01L 21/563 257/723 |
| 2009/0194787 A1 | 8/2009 | Liang |
| 2013/0049216 A1 | 2/2013 | Lin |
| 2014/0349427 A1 | 11/2014 | El-Ghoroury |
| 2015/0287655 A1 | 10/2015 | Killingsworth |

* cited by examiner

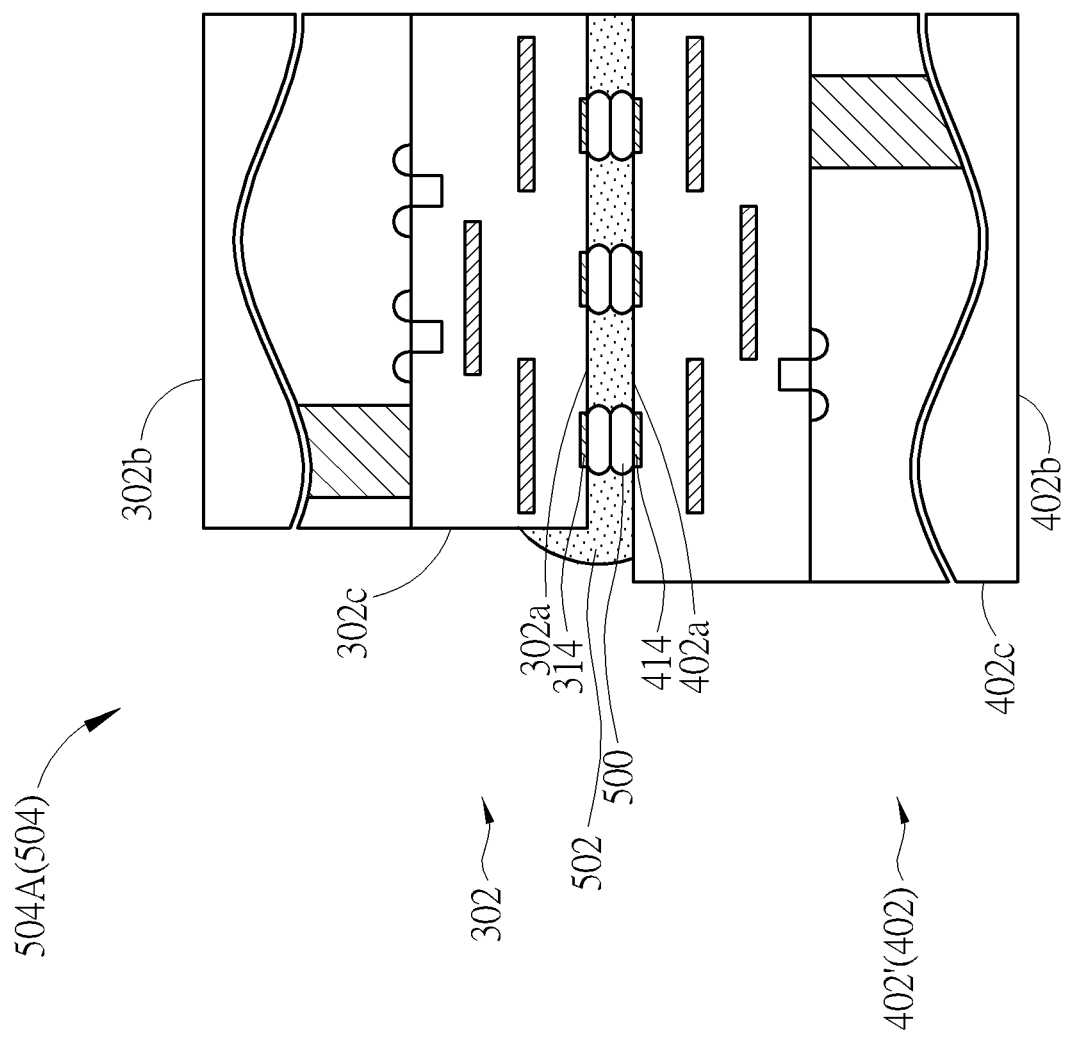

PACKAGE STRUCTURE AND METHOD OF MANUFACTURING THE SAME

CROSS REFERENCE TO RELATED APPLICATIONS

This application is a divisional application of U.S. patent application Ser. No. 14/287,065 filed May 26, 2014, which is herein incorporated by reference in its entirety.

BACKGROUND OF THE INVENTION

1. Field of the Invention

The present invention relates to a semiconductor wafer, a package structure and a method of manufacturing the same, and more particularly, to a semiconductor wafer having array regions and die regions, a package structure and a method of manufacturing the same.

2. Description of the Prior Art

In the modern society, the micro-processor systems comprising integrated circuits (IC) are ubiquitous devices, being utilized in diverse fields such as automatic control electronics, mobile communication devices and personal computers. With the development of technology and the increase of original applications for electrical products, the IC devices are becoming smaller, more delicate and more diversified.

As well known in the art, an IC device is produced from dies that are fabricated by conventional semiconductor manufacturing processes. The process for manufacturing a die starts with a wafer: first, different regions are marked on the wafer; secondly, conventional semiconductor manufacture processes such as deposition, photolithography, etching or planarization are used to form the needed circuit trace(s); then, each region of the wafer is separated to form a die, and packaged to form a chip; finally, the chip is attached onto a board, a printed circuit board (PCB), for example, and the chip is electrically coupled to the pins on the PCB. Thus, each function on the chip can be performed.

In order to achieve the miniaturization demands, new packaging process and package structure are needed.

SUMMARY OF THE INVENTION

The present invention therefore provides a semiconductor wafer, a package structure and a method of manufacturing the same in order to speed up the process and upgrade the yields.

According to one embodiment of the present invention, a method of forming a package structure is provided. First, an array chip including a plurality of first dies is provided. A wafer including a plurality of second dies is provided. A package step is carried out to package the array chip onto the wafer so as to electrically connect the first die and the second die.

According to another embodiment of the present invention, a semiconductor wafer is provided. The semiconductor wafer comprises a plurality of array regions, a plurality of die regions and a plurality of dies. A first gap is disposed between each array region, and a second gap is disposed between each die region. The first gap is greater than the second gap. Each die is disposed correspondingly in each die region.

According to another embodiment of the present invention, a package structure is provided. The package structure comprises a first die and a second die, both the first die and the second die comprise a first surface, a second surface disposed opposite to the first surface, and at least two sidewalls disposed between the first surface and the second surface. The package structure further comprises an underfill layer covering the first surface of the first die, the first surface of the second die and at least one sidewall of the first die, wherein at least one sidewall of the first die is not covered by the underfill layer.

The method in the present invention for forming the package structure is characterized by electrically connecting a plurality of dies on an array chip to a wafer, following by dicing the dies to form a package structure. Comparing with conventional arts, the process can be speeded up and the yields can be upgraded.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1, FIG. 1A, FIG. 2, FIG. 3, FIG. 4, FIG. 4A, FIG. 5, FIG. 5A, FIG. 6, FIG. 6A and FIG. 6B show schematic diagrams of the method of forming a semiconductor structure according to one embodiment in the present invention.

DETAILED DESCRIPTION

To provide a better understanding of the presented invention, preferred embodiments will be described in detail. The preferred embodiments of the present invention are illustrated in the accompanying drawings with numbered elements.

Figure 2:
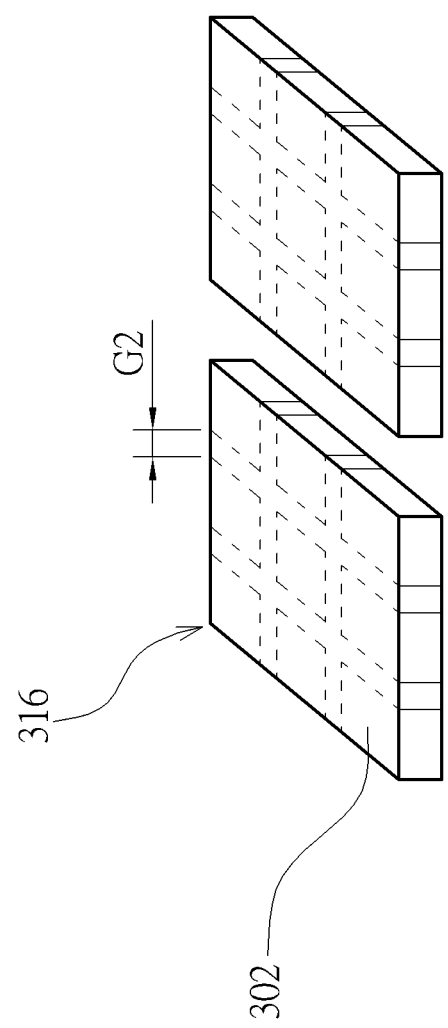
Figure 3:
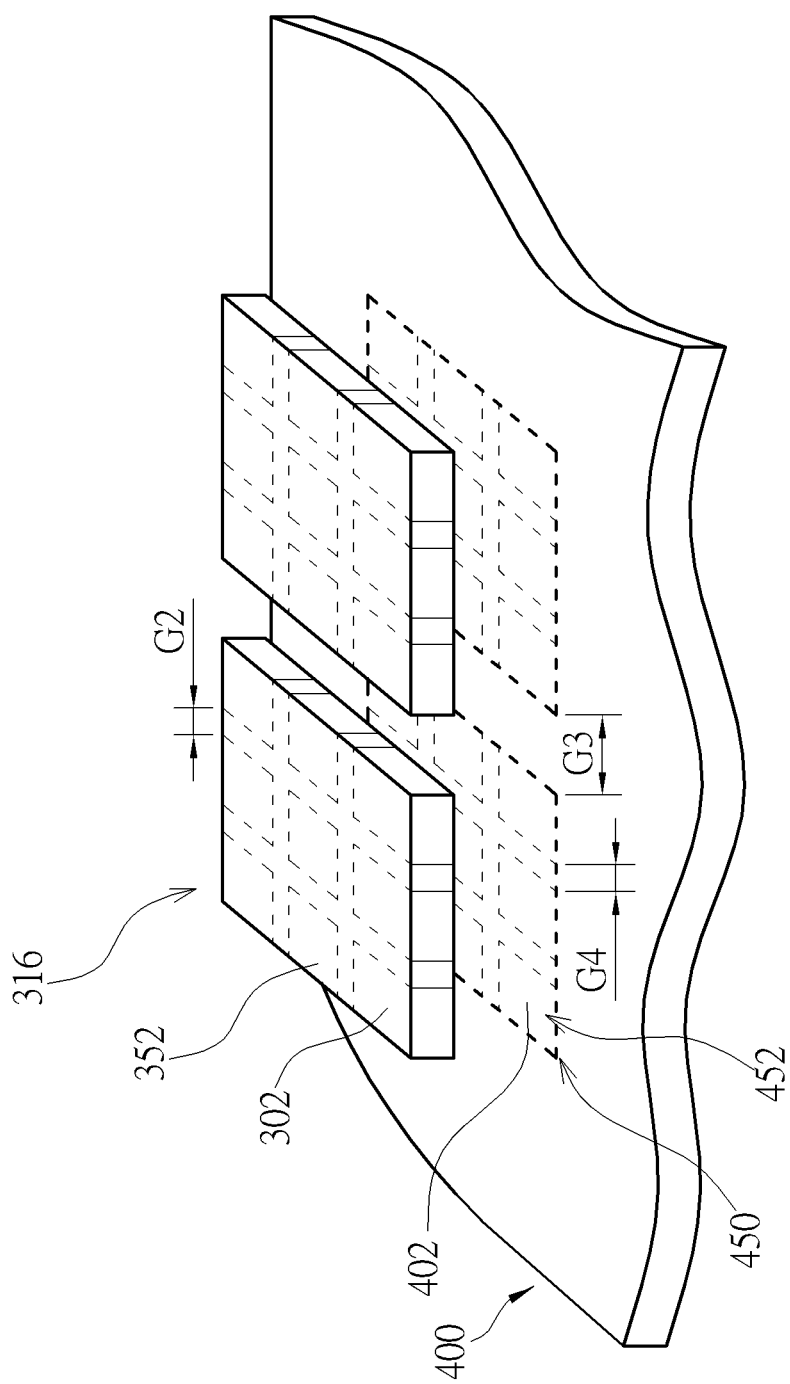
Figure 4:
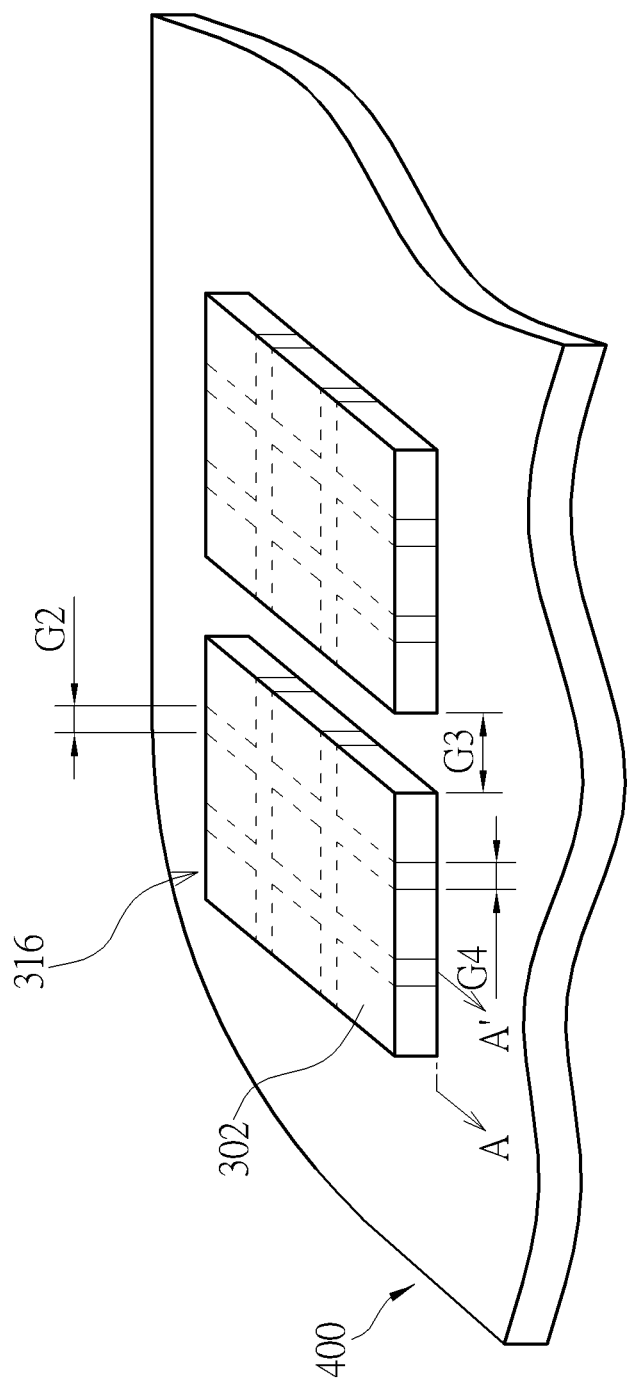
Figure 4A:
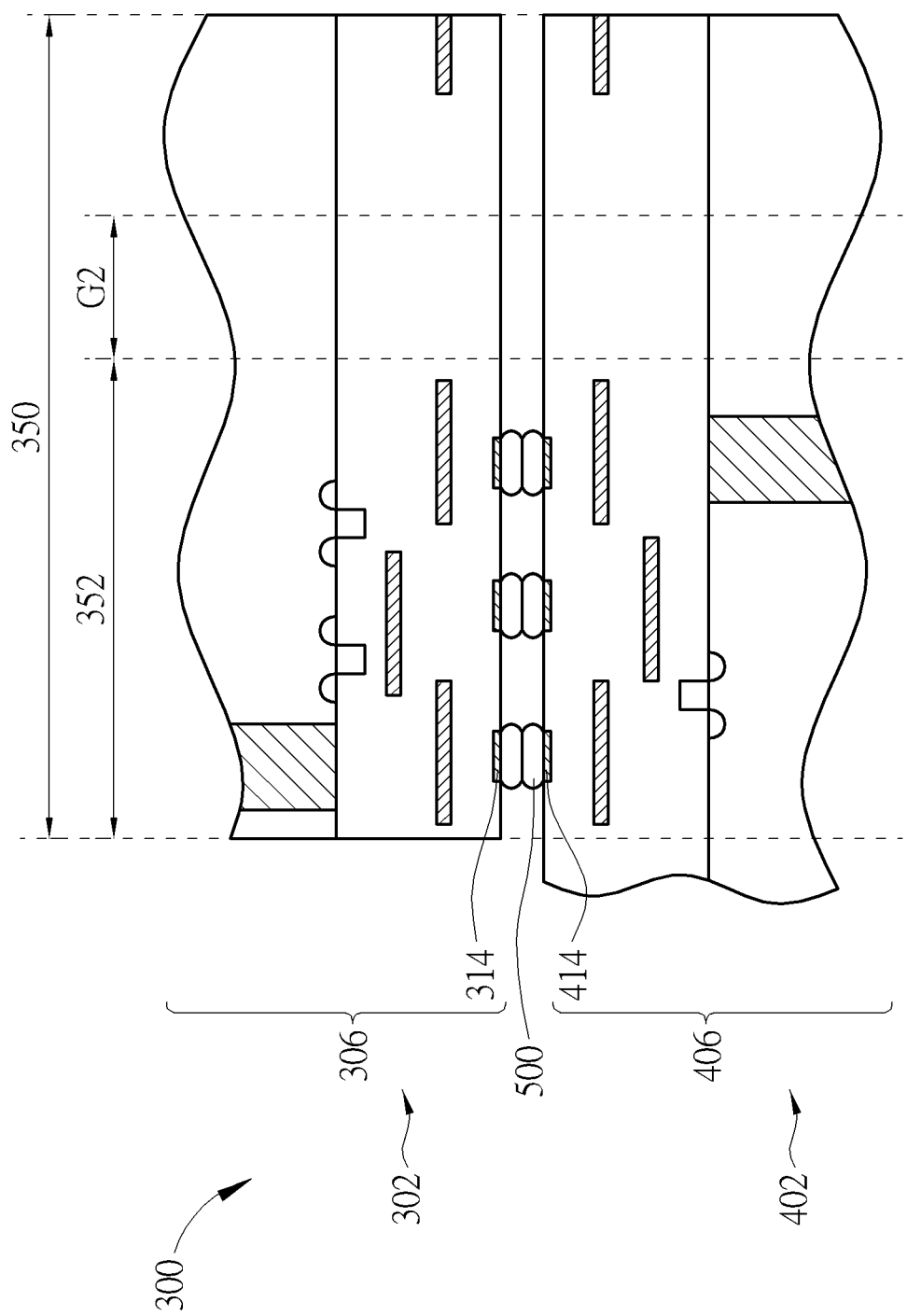
Figure 5:
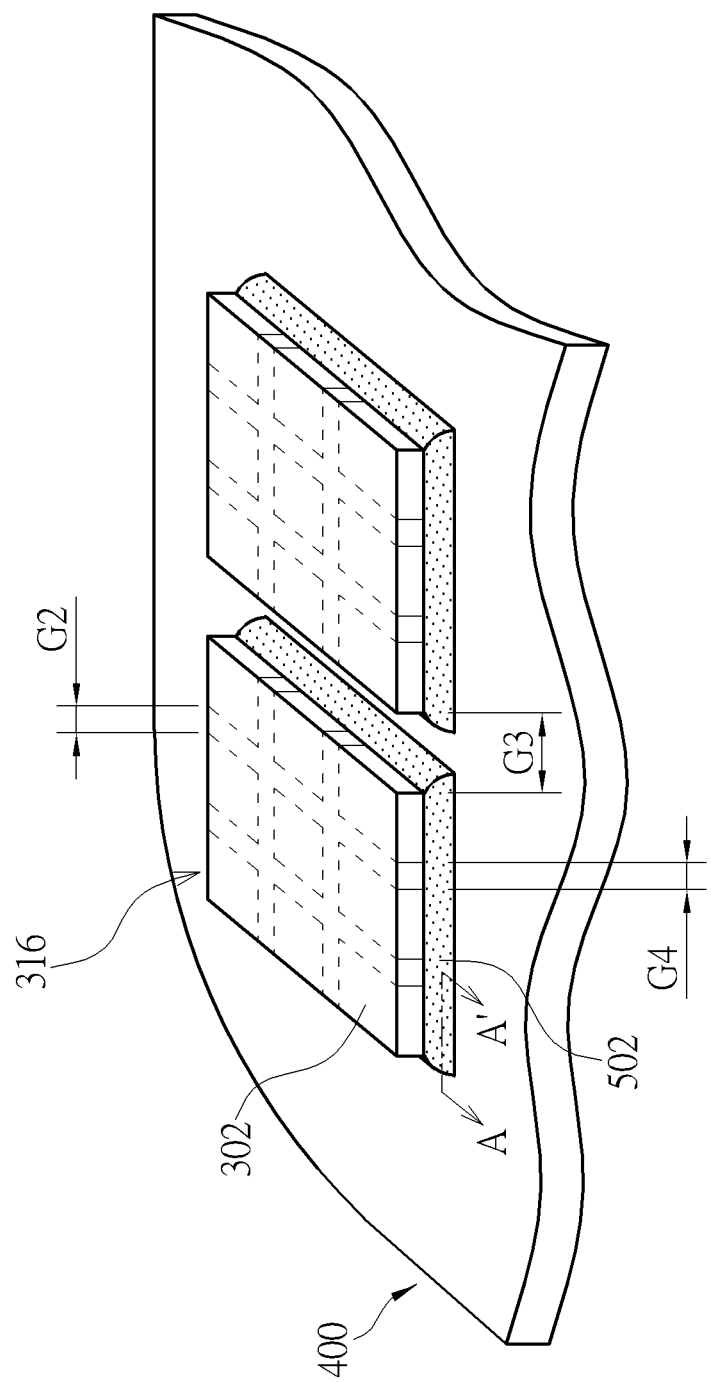
Figure 5A:
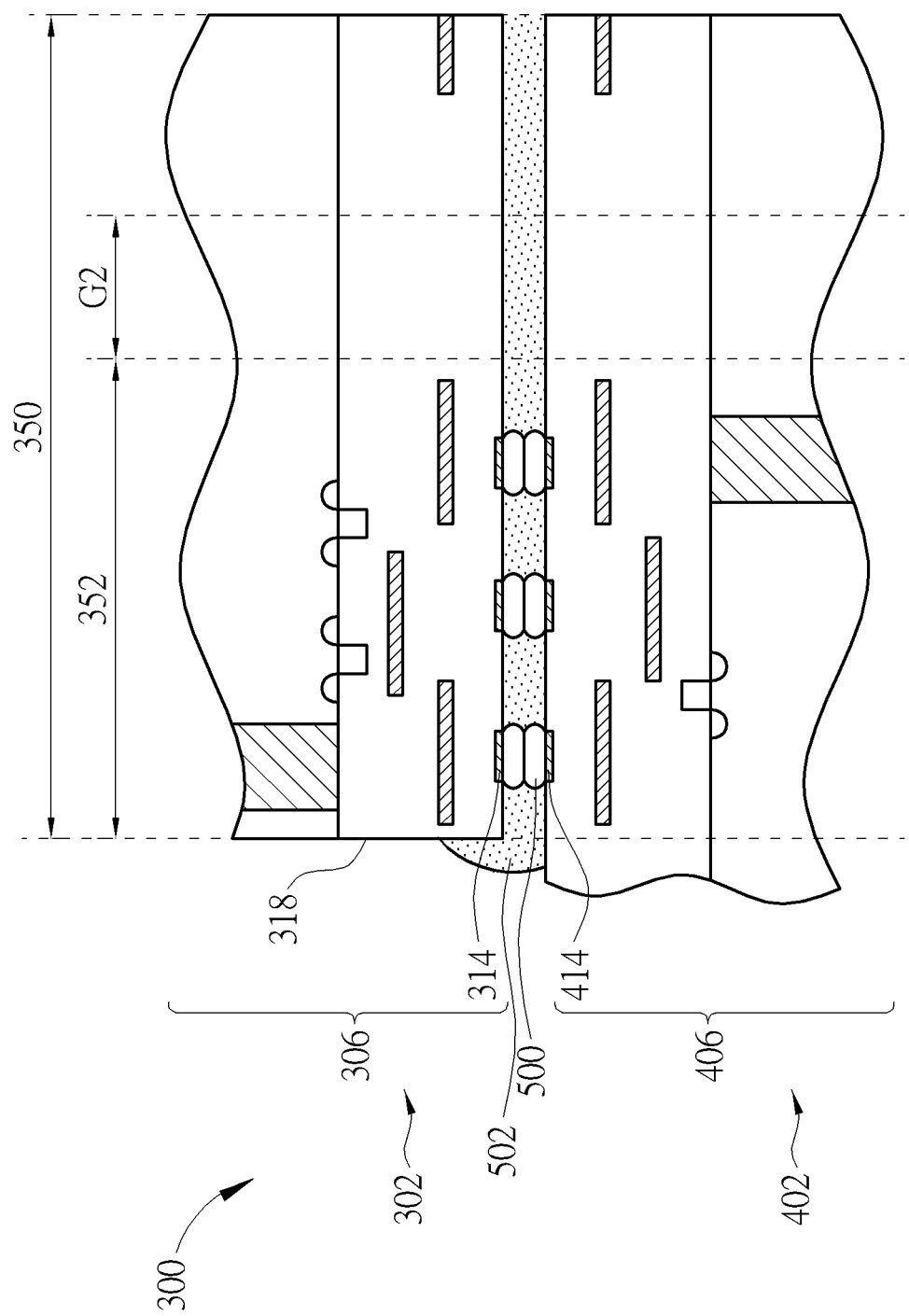
Figure 6:
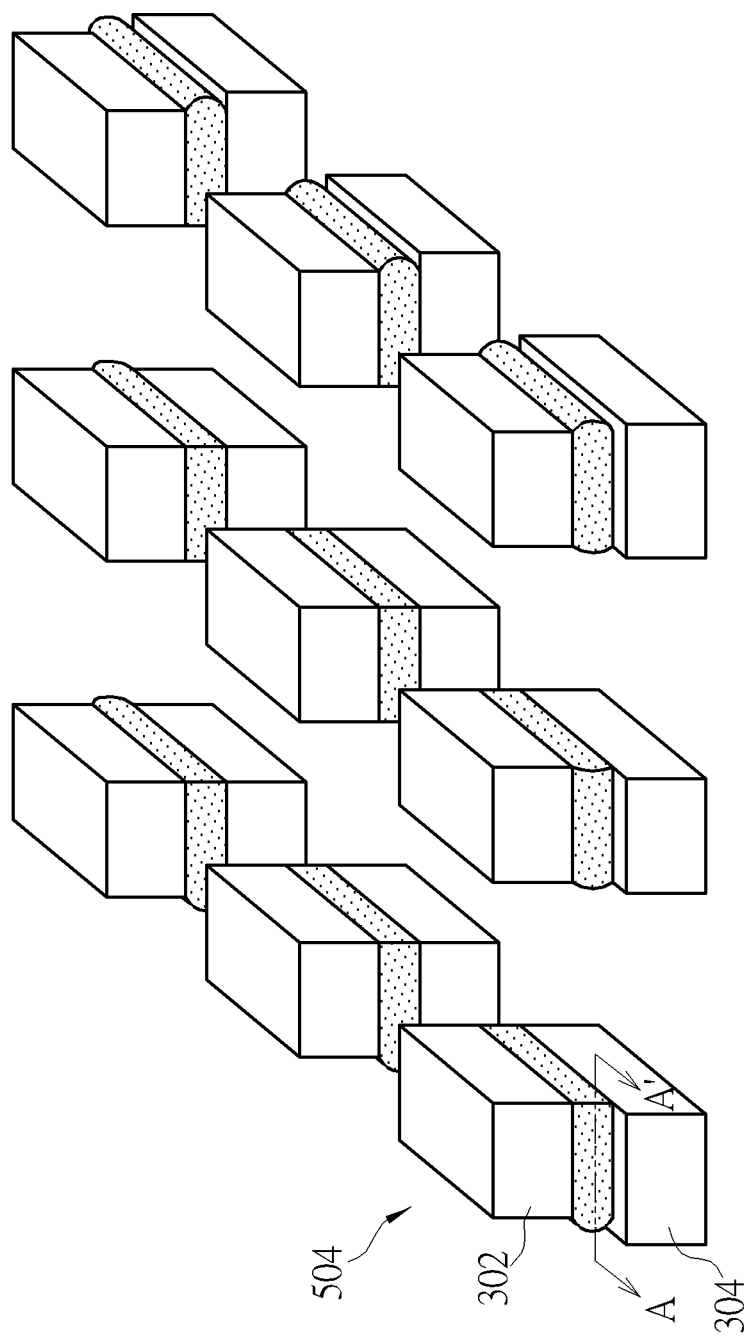
Figure 6B:
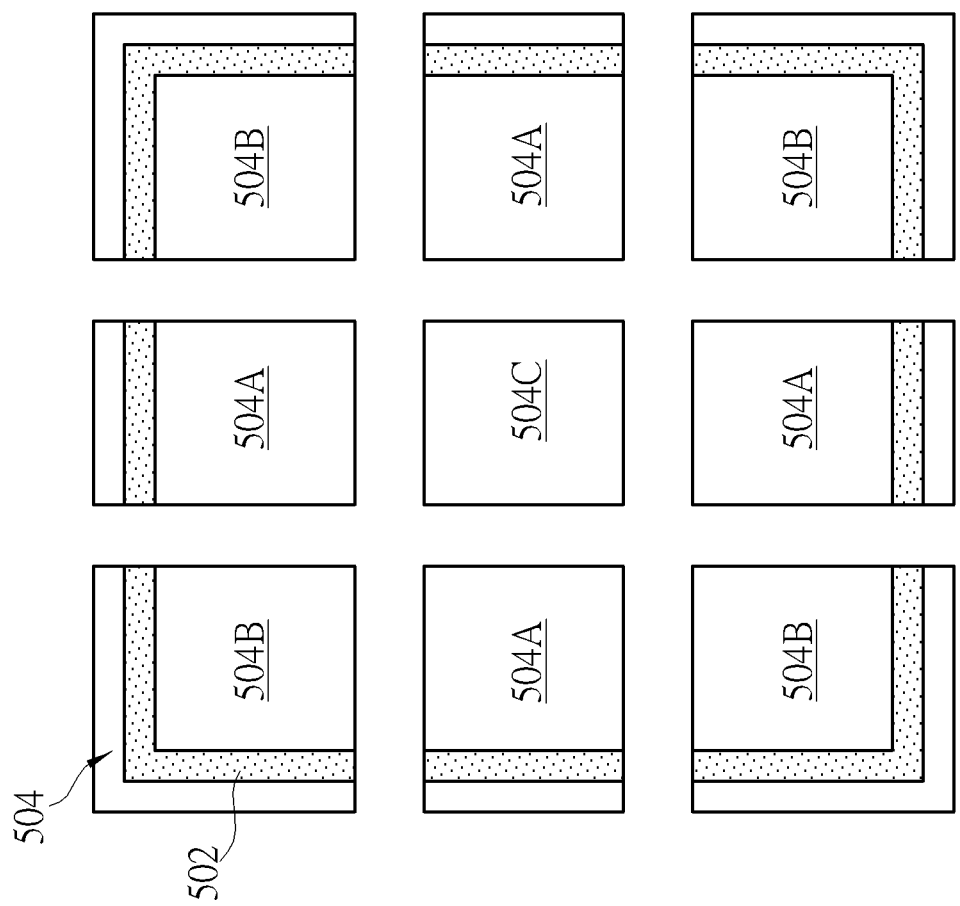

Please refer to FIG. 1, FIG. 2, FIG. 3, FIG. 4, FIG. 4A, FIG. 5, FIG. 5A, FIG. 6, FIG. 6A and FIG. 6B, which show schematic diagrams of the method of forming a semiconductor structure according to one embodiment in the present invention. FIG. 1, FIG. 2, FIG. 3, FIG. 4, FIG. 5 and FIG. 6 are three dimensional views. FIG. 1A shows a cross-sectional view of FIG. 1. FIG. 4A shows a cross-sectional view of FIG. 4. FIG. 5A shows a cross-sectional view of FIG. 5. FIG. 6A shows a cross-sectional view of FIG. 6. FIG. 6B shows a top view of FIG. 6.

Figure 1:
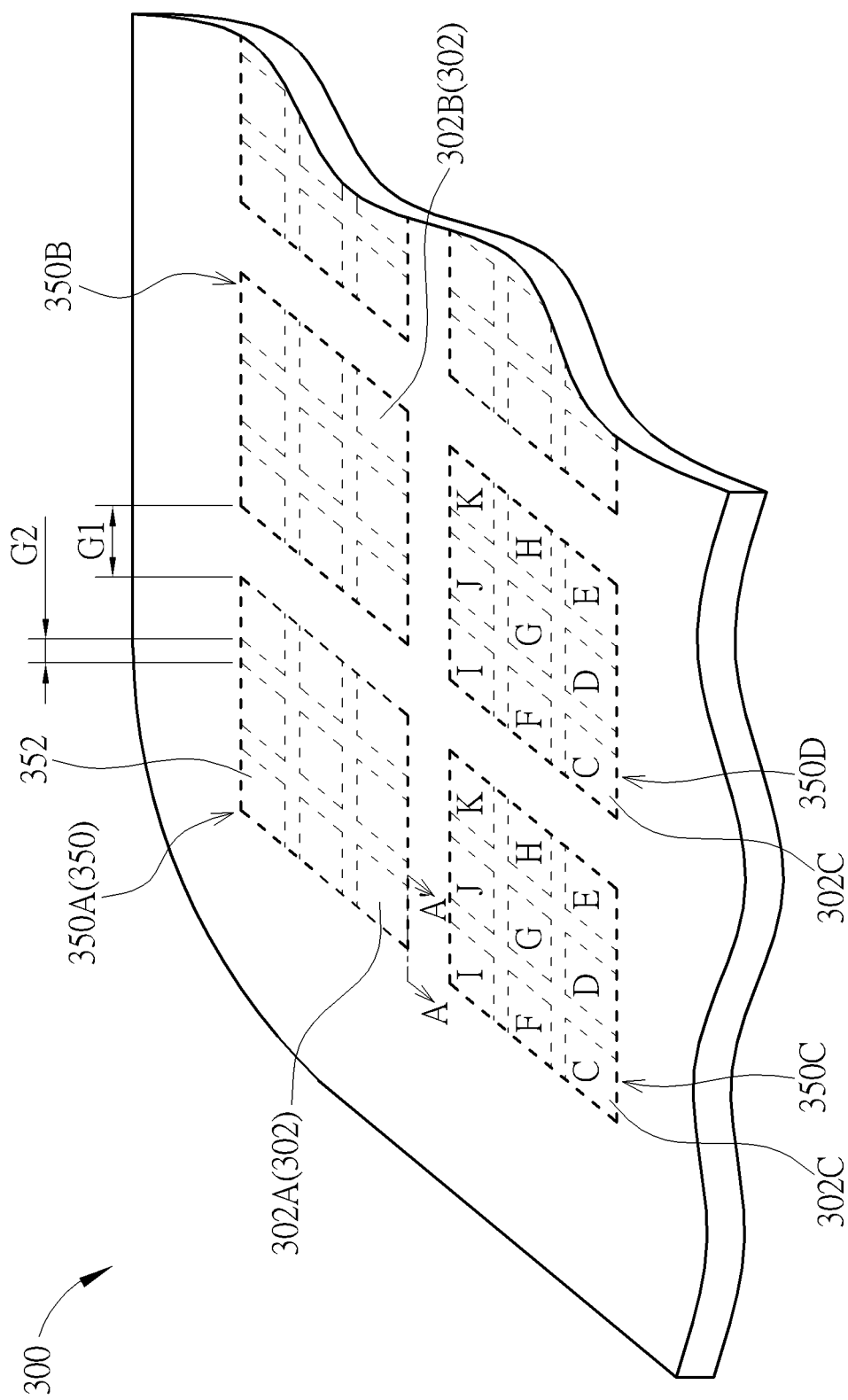
Figure 1A:
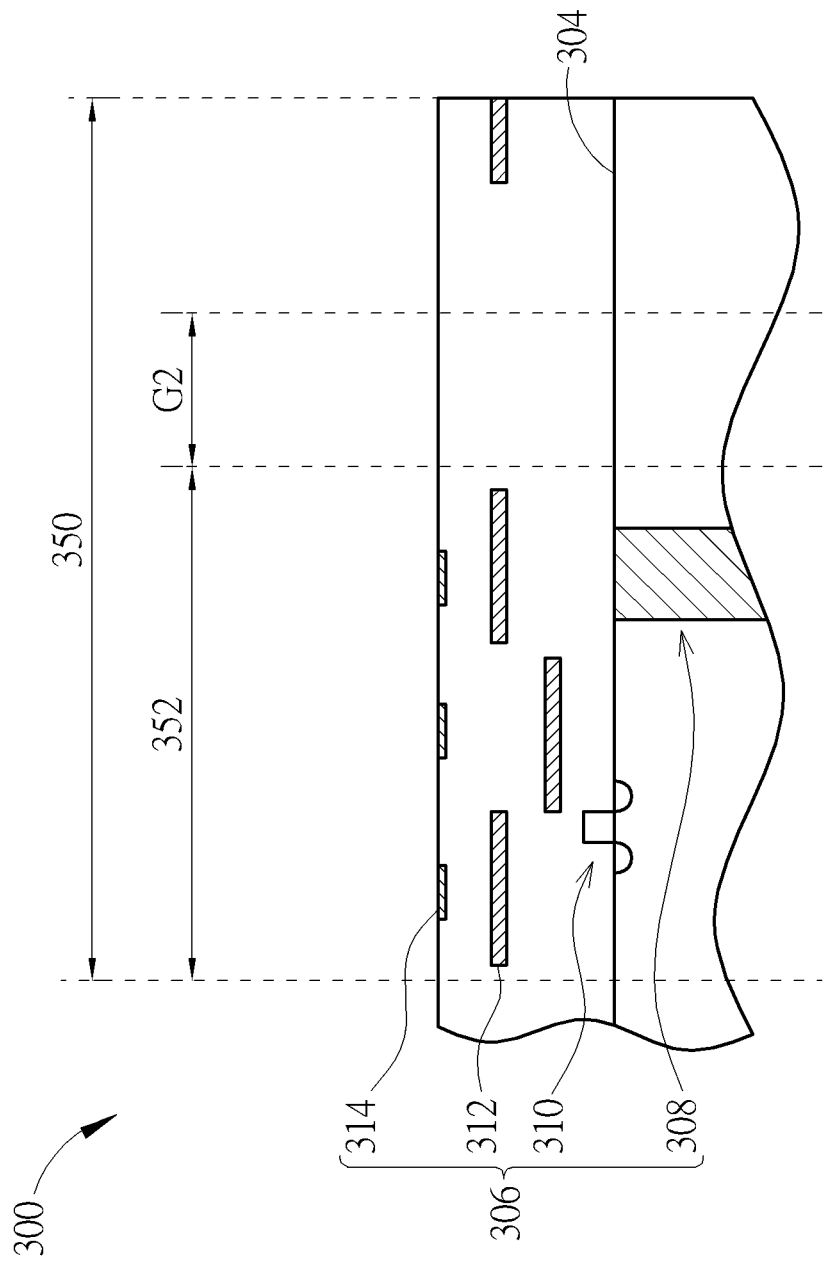

Please refer to FIG. 1 and FIG. 1A, wherein FIG. 1A shows a cross-sectional view taken along AA line in FIG. 1. The forming method of a semiconductor structure in the present invention includes providing a first wafer 300. A plurality of array regions 350 are defined on the first wafer 300. In one embodiment, the array regions 350 are arranged in an array manner. For example, the array regions 350 are arranged by M rows and N columns, such that M×N numbers of array regions 350 are disposed on the first wafer 300, wherein M and N are integers greater than 1. In one preferred embodiment, M is equal to N. In the present invention, a first gap G1 is disposed between each array region 350.

As shown in FIG. 1, a plurality of die regions 352 are defined in each array region 350. In one embodiment, the die regions 352 in one array regions 350 are arranged in an array manner. For example, the die regions 352 are arranged by m rows and n columns, such that m×n numbers of die regions 352 are disposed in one array region 350, wherein m and n are integers greater than 1. In one preferred embodiment, m is equal to n. In the present invention, a second gap G2 is disposed between each die region 352 in one array region 350. In one embodiment, the second gap G2 is less than the first gap G1, in which the difference is greater than 10 microns, for example, between 20 microns and 40 microns. In one embodiment, the first gap G1 is greater than 80 microns, for example, 100 microns. The second gap G2 is between 40 microns and 60 microns. In another embodiment, the first gap G1 can be equal to the second gap G2.

Next, one or more than one semiconductor manufacturing processes are performed to form at least one semiconductor structure 306 on the first wafer 300. As shown in FIG. 1A, the semiconductor structure 306 is formed on one side of the active surface 304 of the first wafer 300. The semiconductor structure 306 may contain a variety of active components or passive components. In one embodiment of the present invention, the semiconductor structure 306 includes, for example, a through silicon via (TSV) 308, a transistor 310, a metal interconnection system 312, and/or a contact pad 314, but is not limited thereto. A first die 302 is therefore defined as the portion of the first wafer 300 in one die region 352 with formed semiconductor structures 306.

Referring to the layout of the first die 302 in the first wafer 300, at least four embodiments are provided in the present invention. In the first embodiment, each of the first dies 302 is identical in the first wafer 300, that is, the layout of the semiconductor structures 306 is identical in each of the first dies 302. In the second embodiment, the first dies 302 in the same array region 350 are substantially identical and the first dies 302 indifferent array regions 350 are not identical. As shown in FIG. 1 for example, the first dies 302A in the array region 350A are identical, the first dies 302B in the array region 350B are identical, but the first dies 302A and the first dies 302B are not identical. In the third embodiment, the first dies 302 in the same array region 350 are not identical, but the arrangement of the first dies 302 in different array region 350 is the same. As shown in FIG. 1 for example, the first dies 302 in the array region 350C are not identical, labeled by C, D, F, G, H, I, J, K; the first dies 302 in the array region 350D are not identical, labeled by C, D, F, G, H, I, J, K. The first die 302C in the array region 350C is identical and is disposed in the same position as the first die 302C in the array region 350D. The first die 302D in the array region 350C is identical and is disposed in the same position as the first die 302D in the array region 350D. In the fourth embodiment, the first dies 302 in the first wafer 300 are all varied. In addition, in one embodiment, the semiconductor structure 306 may be formed in the region outside the die region 350, for instance, between each of the die regions 352 (that is, in the region of the second gap G2), or between each of the array regions 350 (that is, in the region of the first gap G1), in order to serve as a test circuit or a dummy circuit.

Next, as shown in FIG. 2, a first dicing process is performed to the first wafer 300 along the edge of the array region 350, thereby forming a plurality of array chips 316. Each array chip 316 includes a plurality of first dies 302.

Subsequently, as shown in FIG. 3, a second wafer 400 is provided. The second wafer 400 has substantially the same layout as that of the first wafer 300. For example, the second wafer 400 has a plurality of array regions 450, and each array region 450 has a plurality of die regions 452. A third gap G3 is disposed between each array region 450, and a fourth gap G4 is disposed between each die region 452, wherein the third gap G3 is greater than the fourth gap G4. In one embodiment, the fourth gap G4 is substantially equal to the second gap G2 such that the die region 352 of the array chip 316 corresponds to the die region 452 of the array region 450 in the second wafer 400. In one embodiment, the third gap G3 is substantially equal to the first gap G1, but in another embodiment, the third gap G3 and the first gap G1 can be different. The second wafer 400 can have a plurality of semiconductor structures 406 (not shown in FIG. 1), in which the arrangement thereof can be the same or different form that in the first wafer 300.

In another embodiment, the die regions 452 of the second wafer 400 are not necessarily corresponding to the die regions 352 of the first wafer 300 with one-by-one manner but can be in a "one-by-multi" manner. For example, the die region 452 in the second wafer 400 can correspond to more than one die regions 350 in the first wafer 300.

Referring to the arrangement of the second dies 402 in the second wafer 400, four embodiments are also provided. In the first embodiment, each of the second dies 402 is identical in the second wafer 400. In the second embodiment, the second dies 402 in the same array region 450 are substantially identical and the second dies 402 in different array regions 450 are not identical. In the third embodiment, the second dies 402 in the same array region 450 are not identical, but the arrangement of the second dies 402 in different array region 450 is the same. In the fourth embodiment, the second dies 402 in the second wafer 400 are all varied. Preferably, the embodiment of the arrangement of the first dies 302 is the same as that of the second dies 402. For example, when the first wafer 300 utilizes the first embodiment, the second wafer 400 also utilizes the first embodiment. However, depending on the design of the products, they can be different.

Next, as in FIG. 4 and FIG. 4A, a package process is performed to package the array chip 316 correspondingly on the array region 450 of the second wafer 400, so that the first dies 302 of the array chip 316 can be electrically connected to at least one second die 402 in the array region 450 in the second wafer 400. The package step in the present invention refers to any step making the semiconductor structure 306 in the first die 302 electrically connect the semiconductor structure 406 in the second die 402. In one embodiment, as shown in FIG. 4A for example, the package step includes forming a connection unit 500, for instance, a solder ball to electrically connect the contact pad 314 of the first die and the contact pad 414 of the second die 414. In other embodiments, the connection unit 500 may include through silicon via, copper pillars, silicon interposer or wire bonding, and is not be limited thereto.

Next, as shown in FIG. 5 and FIG. 5A, an underfill layer 502 is formed between the array chip 316 and the second wafer 400. In one embodiment, as shown in FIG. 5A, the underfill layer 502 is formed in a space between the first die 302, the second die 402 and the connection unit 500. To ensure that the underfill layer 502 can be filled completely into said space, the underfill layer 502 is further formed in the area outside the edge of the array region 450 on the second wafer 400 and further covers a sidewall 318 of the array chip 316. In one embodiment, the underfill layer 502, for example, includes epoxy resin. Since a larger third gap G3 is between the third array regions 450, the underfill layer 502 can be successfully supplied. On the other hand, the fourth gap G4 between each die region 452 can be reduced, saving the space of the wafer.

Lastly, as in FIG. 6, FIG. 6A and FIG. 6B, a second dicing step is performed to cut the first die 302 and the second die 402 in the same array region, thereby forming a plurality of package structures 504. As shown in FIG. 6, FIG. 6A, FIG. 6B, the package structure 504 comprises the first die 302 and the second die 402, the underfill layer 502 is disposed between the first die 302 and the second die 402. In detail, the first die 302 includes a first surface 302a (e.g., the active surface or a front surface), a second surface 302b (e.g., the back surface), and a plurality of sidewalls 302c located between the first surface 302a and the second surface 302b. The second die 402 includes a first surface 402a, a second surface 402b, and a plurality of sidewalls 402c located between the first surface 402a and the second surface 402b.

In one embodiment, when performing the second dicing process, the cutting line slightly protrudes outside the array region 450, such that during the second dicing process, the underfill layer 502 is not cut or only a portion of underfill layer 502 is cut. Consequently, three types of package structures 504A, 504B, and 504C are formed. As shown in FIG. 6 and FIG. 6B, referring to the package structures 504A adjacent to the edge of the array region 450, only one sidewall 302c of the first dies 302 is covered by the underfill layer 502 (please also see FIG. 6A), and the other three sidewalls are not covered by the underfill layer 502. Referring to the package structures 504B at the corner, two sidewalls 302c of the first dies 302 is covered by the underfill layer 502, and the other two sidewalls 302c are not covered by the underfill layer 502. Referring to the rest of the package structure 504C, the sidewalls 302c are not covered by the underfill layer 502. In addition, as shown in FIG. 6A, the first surface 402a and the second surface 402b of the second die 402' is greater than the first surface 302a and the second surface 302b of the second die 302.

Further, the second dicing process is performed along the die region 350 of the array chip 316 or along the die region 452 of the second wafer 400. In one embodiment of the "one-by-multi" package, the dicing line is along the die region with larger area. For example, when a plurality of die regions 352 of the array chip 346 correspond to one die region 452 of the second wafer 400, the dicing line of the second dicing process is along the die region 452 of the second wafer 400. Subsequently, the package structure 504 can be further subjected to subsequent packaging process.

The method in the present invention for forming the package structure is characterized by electrically connecting a plurality of dies on an array chip to a wafer, following by dicing the dies to form a package structure. Comparing to conventional arts, such as "chip-to-wafer" package process which bonds each of the dies individually to one wafer, this convention art requires a larger space between each die so as to supply the underfill layer (for example, the space between each die is greater than 80 microns), and it is also time consuming. Comparing to another conventional art, such as "wafer-to-wafer" process, which bonds one wafer directly to another wafer, this conventional art requires precise aligning technique, and the problems of wafer migration or dust contamination are easy to occur. The present invention is able to achieve a balance in the above prior arts, and can improve the process speed, while maintaining the product yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package structure, comprising:
   a first die and a second die, both the first die and the second die comprise:
      a first surface;
      a second surface disposed opposite to the first surface; and
      at least two sidewalls disposed between the first surface and the second surface; and
   an underfill layer covering and directly contacting the first surface of the first die, the first surface of the second die and at least one sidewall of the first die, wherein at least one sidewall of the first die is and both two sidewalls of the second die are not covered by the underfill layer, wherein at least one sidewall of the underfill layer, the at least one sidewall of the first die which is not covered by the underfill layer and one of the two sidewalls of the second die which are not covered by the underfill layer are coplanar with each other along a first direction, and wherein the first direction is perpendicular to the first surface.

2. The package structure according to claim 1, wherein the underfill layer covers two sidewalls of the first die.

3. The package structure according to claim 1, wherein at least one sidewall of the first die is covered by the underfill layer and the other sidewalls of the first die is not covered by the underfill layer.

4. The package structure according to claim 1, wherein the first surface of the second die is greater than the first surface of the first die.

\* \* \* \* \*